(12) United States Patent
Ueno

(10) Patent No.: US 7,057,459 B2
(45) Date of Patent: Jun. 6, 2006

(54) SEMICONDUCTOR INTEGRATED CIRCUIT

(75) Inventor: Masaji Ueno, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 10/869,863

(22) Filed: Jun. 18, 2004

(65) Prior Publication Data

US 2005/0017809 A1    Jan. 27, 2005

(30) Foreign Application Priority Data

Jun. 20, 2003   (JP)   ............................. 2003-176079
Jun. 10, 2004   (JP)   ............................. 2004-172157

(51) Int. Cl.
*H03F 3/45*   (2006.01)
(52) U.S. Cl. ...................... 330/255; 330/264
(58) Field of Classification Search ................ 330/255, 330/263, 264
See application file for complete search history.

(56) References Cited

U.S. PATENT DOCUMENTS

| | | | | |
|---|---|---|---|---|
| 4,766,394 A | * | 8/1988 | Yukawa | 330/255 |
| 5,311,145 A | | 5/1994 | Huijsing et al. | 330/255 |
| 6,262,633 B1 | * | 7/2001 | Close | 330/255 |
| 6,798,292 B1 | * | 9/2004 | Viswanathan | 330/257 |

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

A semiconductor integrated circuit includes first and second differential amplification devices to amplify a voltage difference of input signals inputted from a positive input terminal and a negative input terminal, first and second addition devices to add an output of the first differential amplification device and the output of the second differential amplification device, an output stage control device controlled by the first and second addition devices, and output stage controlled by the output stage control device, and an output terminal connected to the output stage.

19 Claims, 4 Drawing Sheets

US 7,057,459 B2

SEMICONDUCTOR INTEGRATED CIRCUIT

CROSS REFERENCE TO RELATED APPLICATION

This patent application claims the benefit of priority from Japanese Patent Application No. 2004-172157, filed on Jun. 10, 2004; the content of which is incorporated herein by reference in its entirety.

FIELD OF THE INVENTION

This invention relates to a semiconductor integrated circuit including an output amplifier.

DESCRIPTION OF THE BACKGROUND

Displaying an LCD (Liquid Crystal Display) is controlled by an LCD driver. An output stage of the driver has an output amplifier for an output signal. It is often suitable to use a Rail-to-Rail amplifier whose output amplitude swings fully in the power supply voltage range as the output amplifier.

U.S. Pat. No. 5,311,145 issued May 10, 1994 describes a circuit of an amplifier which performs Rail-to-Rail operation including a differential amplifier.

In addition, since high-speed operation is also required of an LCD driver, an amplifier having a high Slew Rate (SR) is needed.

An article described by T. Itakura et al. entitled, "A 402-Output TFT-LCD Driver IC With Power Control Based on the Number of Colors Selected" in the IEEE JSSC, vol.38, No3, March 2003, p.503–510, describes a circuit of an amplifier which has SR Enhancement. This SR Enhancement contains a Class-C amplifier which operates during a falling edge of an output signal.

However, the SR Enhancement has a problem of distorting a signal waveform generated at end of the falling edge. A Class-C amplifier switches off at the falling edge of an output signal, and the above problem is occurred because a driving force of an amplifier declines rapidly.

In addition, it is necessary to insert a condenser between a drain and a gate of an output transistor for phase compensation of an output amplifier. In order to obtain sufficient phase compensation, this condenser needs comparatively large capacity. However, in order to obtain a high SR, it is necessary to flow large charge and discharge current to the condenser. As a result a power consumption of the amplifier becomes large. This is a serious problem for example, in a portable apparatus for which low power consumption operation is needed.

SUMMARY OF THE INVENTION

One aspect of the present invention is to provide a semiconductor integrated circuit that comprises a first differential amplification device with a first polarity, the first differential amplification device being configured to amplify a voltage difference of two input signals inputted from a positive input terminal and a negative input terminal respectively, a second differential amplification device with a second polarity opposite of the first polarity, the second differential amplification device being configured to amplify the voltage difference of two input signals inputted from the positive input terminal and the negative input terminal respectively, a first addition device configured to add a non-inverted output of the first differential amplification device and an inverted output of the second differential amplification device, a second addition device configured to add a non-inverted output of the second differential amplification device and an inverted output of the first differential amplification device, an output stage control device having first and second switching elements, the first switching element with the first polarity controlled by an output signal of the second addition device, and the second switching element with the second polarity controlled by an output signal of the first addition device, an output stage having a third switching element with the first polarity controlled by an output signal of the first switching element of the output stage control device, and a fourth switching element with the second polarity controlled by an output signal of the second switching element of the output stage control device, and an output terminal configured to be connected to an output terminal of the third switching element and an output terminal of the fourth switching element in common.

One aspect of the present invention is to provide a semiconductor integrated circuit that comprises a positive input terminal, a negative input terminal, a first differential amplification circuit with a first polarity having a first positive input terminal connected to the positive input terminal, a first negative input terminal connected to the negative input terminal, a first non-inverted output terminal configured to output an output signal, the output signal being amplified a voltage difference of two input signals inputted from the first positive input terminal and the first negative input terminal, and a first inverted output terminal outputting an inverted output signal being inverted signal of the output signal of the first non-inverted output terminal, a second differential amplification circuit with a second polarity opposite of the first polarity, having a second positive input terminal connected to the positive input terminal, a second negative input terminal connected to the negative input terminal, a second non-inverted output terminal configured to output an output signal, the output signal being amplified a voltage difference of two input signals inputted from the second positive-input terminal and the second negative input terminal, and a second inverted output terminal outputting an inverted output signal being inverted signal of the output signal of the second non-inverted output terminal, a first current addition device configured to add a current, the current being configured to flow at the first non-inverted output terminal of the first differential amplification circuit and a current, the current being configured to flow at the second inverted output terminal of the second differential amplification circuit, a second current addition device configured to add a current, the current being configured to flow at the second non-inverted output terminal of the second differential amplification circuit and a current, the current being configured to flow at the first inverted output terminal of the first differential amplification circuit, an output stage control device having a first switching element with the first polarity having a control terminal connected to an output terminal of the second current addition device, and a second switching element with the second polarity having a control terminal connected to an output terminal of the first current addition device, an output stage having a third switching element with the first polarity having a control terminal connected to an output terminal of the first switching element, and a fourth switching element with the second polarity having a control terminal connected to an output terminal of the second switching element, an output terminal configured to be connected an output terminal of the third switching element and an output terminal of the fourth switching element in common, a first phase compensation circuit connecting between the output terminal of the third switching element and the control terminal of the third switching element, and a second phase compensation circuit connecting between the output terminal of the fourth switching element and the control terminal of the fourth switching element.

One aspect of the present invention is to provide a semiconductor integrated circuit that comprises a first bias voltage terminal, a second bias voltage terminal, a positive input terminal, a negative input terminal, a first differential amplification circuit with a first polarity having a first positive input terminal connected to the positive input terminal, a first negative input terminal connected to the negative input terminal, a first non-inverted output terminal configured to output an output signal, the output signal being amplified a voltage difference of two input signals inputted from the first positive input terminal and the first negative input terminal, and a first inverted output terminal outputting an inverted output signal being inverted signal of the output signal of the first non-inverted output terminal, a second differential amplification circuit with a second polarity opposite of the first polarity, having a second positive input terminal connected to the positive input terminal, a second negative input terminal connected to the negative input terminal, a second non-inverted output terminal configured to output an output signal, the output signal being amplified a voltage difference of two input signals inputted from the second positive-input terminal and the second negative input terminal, and a second inverted output terminal outputting an inverted output signal being inverted signal of the output signal of the second non-inverted output terminal, a first current addition device configured to add a current, the current being configured to flow at the first non-inverted output terminal of the first differential amplification circuit and a current, the current being configured to flow at the second inverted output terminal of the second differential amplification circuit, a second current addition device configured to add a current, the current being configured to flow at the second non-inverted output terminal of the second differential amplification circuit and a current, the current being configured to flow at the first inverted output terminal of the first differential amplification circuit, an output stage control device having a first switching element with the first polarity having a control terminal connected to an output terminal of the second current addition device, a second switching element with the second polarity having a control terminal connected to an output terminal of the first current addition device, a third switching element controlling an output voltage of the second switching element with the first polarity having a control terminal connected to the first bias voltage terminal, and a fourth switching element controlling an output voltage of the first switching element with the second polarity having a control terminal connected to the second bias voltage terminal, an output stage having a fifth switching element with the first polarity having a control terminal connected to an output terminal of the first switching element, and a sixth switching element with the second polarity having a control terminal connected to an output terminal of the second switching element, an output terminal configured to be connected an output terminal of the fifth switching element and an output terminal of the sixth switching element in common, a first phase compensation circuit connecting between the output of the fifth switching element terminal and the control terminal of the fifth switching element, and a second phase compensation circuit connecting between the output terminal of the sixth switching element and the control terminal of the sixth switching element.

DETAILED DESCRIPTION OF THE EMBODIMENTS

Figure 1:
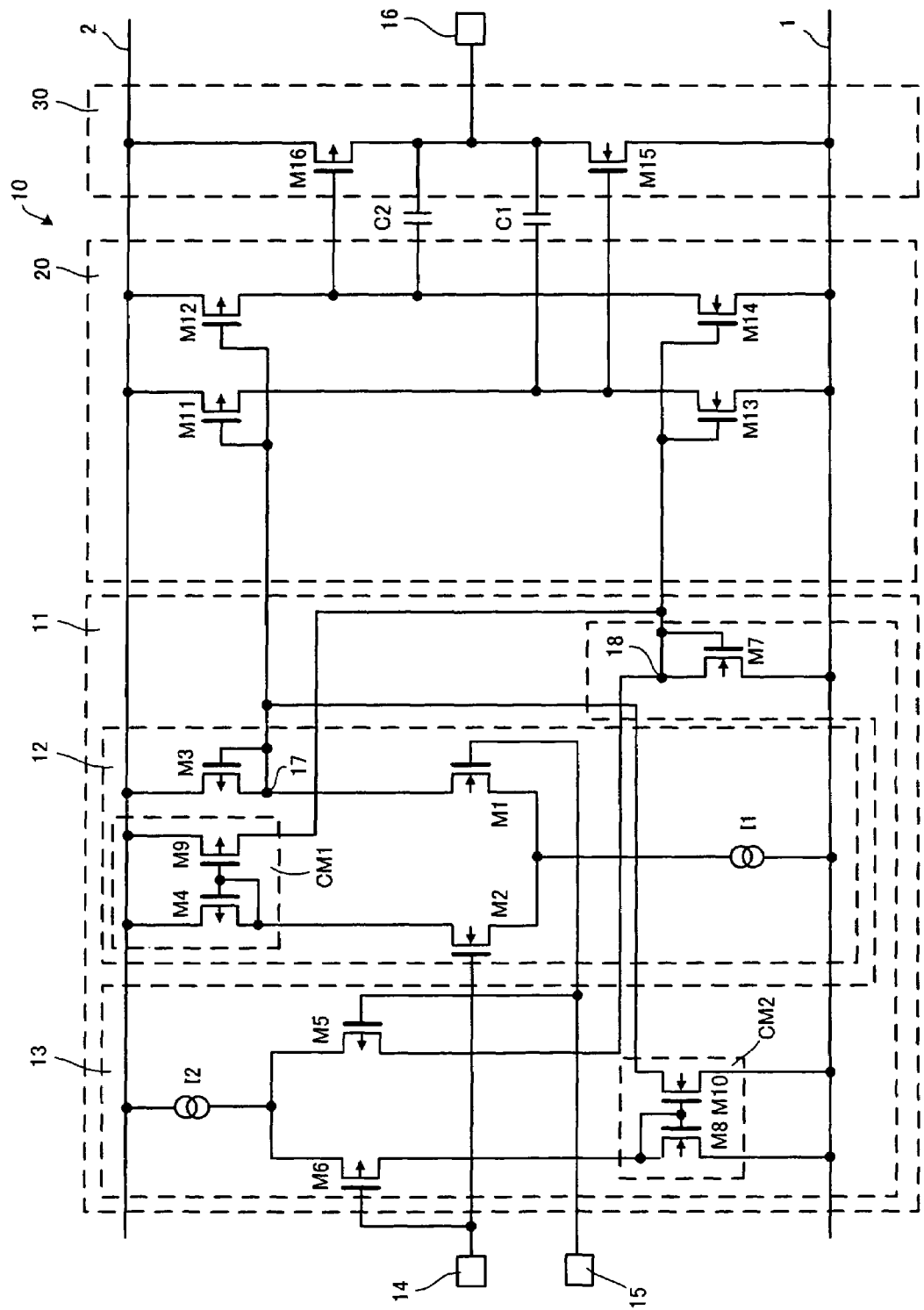
FIG. 1 is a circuit diagram showing a first embodiment of a semiconductor integrated circuit including an output amplifier according to the present invention.

Exemplary embodiments of the present invention will be explained in reference to the drawing as follows.

FIG. 1 is a circuit diagram of a semiconductor integrated circuit including an output amplifier concerning a first embodiment in accordance with the present invention.

Output amplifier 10 includes two input terminals (positive input terminal 14, negative input terminal 15), output terminal 16, differential amplification circuit 11, output stage control circuit 20, and output stage 30.

Differential amplification circuit 11 includes N type differential amplification circuit 12 having n channel transistors forming an input stage, and P type differential amplification circuit 13 having p channel transistors.

If first power supply 1 is set to 0V and second power supply 2 is set to 5V, N type differential amplification circuit 12 carries out differential amplification operation within the range of 1V to 5V, and P type differential amplification circuit 13 carries out differential amplification operation within the range of 0V to 4V. Therefore, it can amplify Rail to Rail of 0V to 5V by combining these two differential amplification circuits.

N type differential amplification circuit 12 has n type MOS transistors M1 and M2, p type MOS transistors M3 and M4, and current source I1.

P type differential amplification circuit 13 has p type MOS transistors M5 and M6, n type MOS transistors M7 and M8, and current source I2.

Positive input terminal (+input terminal) 14 is connected to a gate electrode of n type MOS transistor M2 of N type differential amplification circuit 12, and a gate electrode of p type MOS transistor M6 of P type differential amplification circuit 13, respectively.

Similarly, negative input terminal (−input terminal) 15 is connected to a gate electrode of n type MOS transistor M1 of N type differential amplification circuit 12, and a gate electrode of p type MOS transistor M5 of P type differential amplification circuit 13, respectively.

An inverted output current of N type differential amplification circuit 12 flows through p type MOS transistor M4. A drain electrode of p type MOS transistor M9 which forms first current mirror circuit CM1 with p type MOS transistor M4 is connected to non-inverted output terminal 18 of P type differential amplification circuit 13.

An inverted output current of P type differential amplification circuit 13 flows through n type MOS transistor M8. A drain electrode of an n type MOS transistor M10 which forms second current mirror circuit CM2 with n type MOS transistor M8 is connected to non-inverted output terminal 17 of N type differential amplification circuit 12.

Output stage control circuit 20 includes two p type MOS transistors M11 and M12 and two n type MOS transistors M13 and M14.

Both gate electrodes of p type MOS transistors M11 and M12 are connected to non-inverted output terminal 17 of N type differential amplification circuit 12, and both source electrodes of p type MOS transistors M11 and M12 are connected to second power supply 2.

Both gate electrodes of n type MOS transistors M13 and M14 are connected to non-inverted output terminal 18 of P type differential amplification circuit 13, and both source electrodes of n type MOS transistors M13 and M14 are connected to first power supply 1.

A drain electrode of p type MOS transistor M11 is connected to a drain electrode of n type MOS transistor M13, and a drain electrode of p type MOS transistor M12 is connected to a drain electrode of n type MOS transistor M14.

As shown in FIG. 1, output stage 30 includes n type MOS transistor M15 and p type MOS transistor M16.

N type MOS transistor M15 has a source electrode connected to first power supply 1, and a drain electrode connected to a drain electrode of p type MOS transistor M16.

A source electrode of p type MOS transistor M16 is connected to second power supply 2.

A gate electrode of n type MOS transistor M15 is connected to a drain electrode of n type MOS transistor M13 of output control circuit 20.

Similarly, a gate electrode of p type MOS transistor M16 is connected to a drain electrode of p type MOS transistor M12 of output stage control circuit 20.

The drain electrode of n type MOS transistor M15 and the drain electrode of p type MOS transistor M16 of output stage 30 are connected in common to output terminal 16 of output amplifier 10.

First phase compensation condenser C1 is inserted between the drain electrode and the gate electrode of n type MOS transistor M15, and second phase compensation condenser C2 is inserted between the drain electrode and the gate electrode of p type MOS transistor M16.

Next, signal processing of output amplifier 10 of the embodiment shown in FIG. 1 is explained.

A difference between a voltage inputted from +input terminal 14 and a voltage inputted from −input terminal 15 is amplified by N type differential amplification circuit 12, and is outputted from the drain electrode of p type MOS transistor M3.

Similarly, a difference between a voltage inputted from +input terminal 14 and a voltage inputted from −input terminal 15 is amplified by P type differential amplification circuit 13, and is outputted from the drain electrode of n type MOS transistor M7.

An inverted output current of N type differential amplification circuit 12 flows through p type MOS transistor M4.

A drain current of p type MOS transistor M9, which constitutes first current mirror circuit CM1 with p type MOS transistor M4, is an inverted output signal of N type differential amplification circuit 12.

Since the drain electrode of p type MOS transistor M9 is connected to the drain electrode of n type MOS transistor M7 which is non-inverted output terminal 18 of P type differential amplification circuit 13, an inverted output current of N type differential amplification circuit 12 can be added to a non-inverted output current of P type differential amplification circuit 13.

Similarly, the inverted output current of P type differential amplification circuit 13 flows through n type MOS transistor M8.

A drain current of n type MOS transistor M10, which constitutes second current mirror circuit CM2 with n type MOS transistor M8 in FIG. 1, is an inverted output signal of P type differential amplification circuit 13.

Since the drain electrode of n type MOS transistor M10 is connected to the drain electrode of p type MOS transistor M3, which is non-inverted output terminal 17 of N type differential amplification circuit 12, an inverted output current of P type differential amplification circuit 13 can be added to a non-inverted output current of N type differential amplification circuit 12.

Two output signals that results of the addition described above are inputted into output stage control circuit 20.

P type MOS transistors M11 and M12 are controlled not only by the non-inverted output signal of N type differential amplification circuit 12 but also by an inverted output signal of P type differential amplification circuit 13.

Similarly, n type MOS transistors M13 and M14 are controlled not only by the non-inverted output signal of P type differential amplification circuit 13 but also by the inverted output signal of N type differential amplification circuit 12.

N type MOS transistor M15 and p type MOS transistor M16 constitute output stage 30. Then n type MOS transistor M15 is controlled by the drain voltage of n type MOS transistor M13 inputted into the gate electrode. And p type MOS transistor M16 is controlled by the drain voltage of the drain voltage of p type MOS transistor M12 inputted into the gate electrode.

That is, n type MOS transistor M15 and p type MOS transistor M16 may be controlled by tuning a current ratio of the current mirror circuit of p type MOS transistors M3, M11, and M12, and the current mirror circuit of n type MOS transistors M7, M13, and M14 finely, respectively.

In the embodiment illustrated in FIG. 1, both output signals of N type differential amplification circuit 12 and P type differential amplification circuit 13 are used as direct control signals not only to p type MOS transistor M16 but also to n type MOS transistor M15 of output stage 30, so linear control of output stage 30 may be realized.

Thus, it is not necessary to use the Enhancement circuit which performs Class-C operation for control of one output transistor in a conventional technology, and it is not necessary to boost current, which has been done in the conventional technology.

As a result, distortion of an output waveform by switching of Class-C operation may be avoided.

Figure 2:
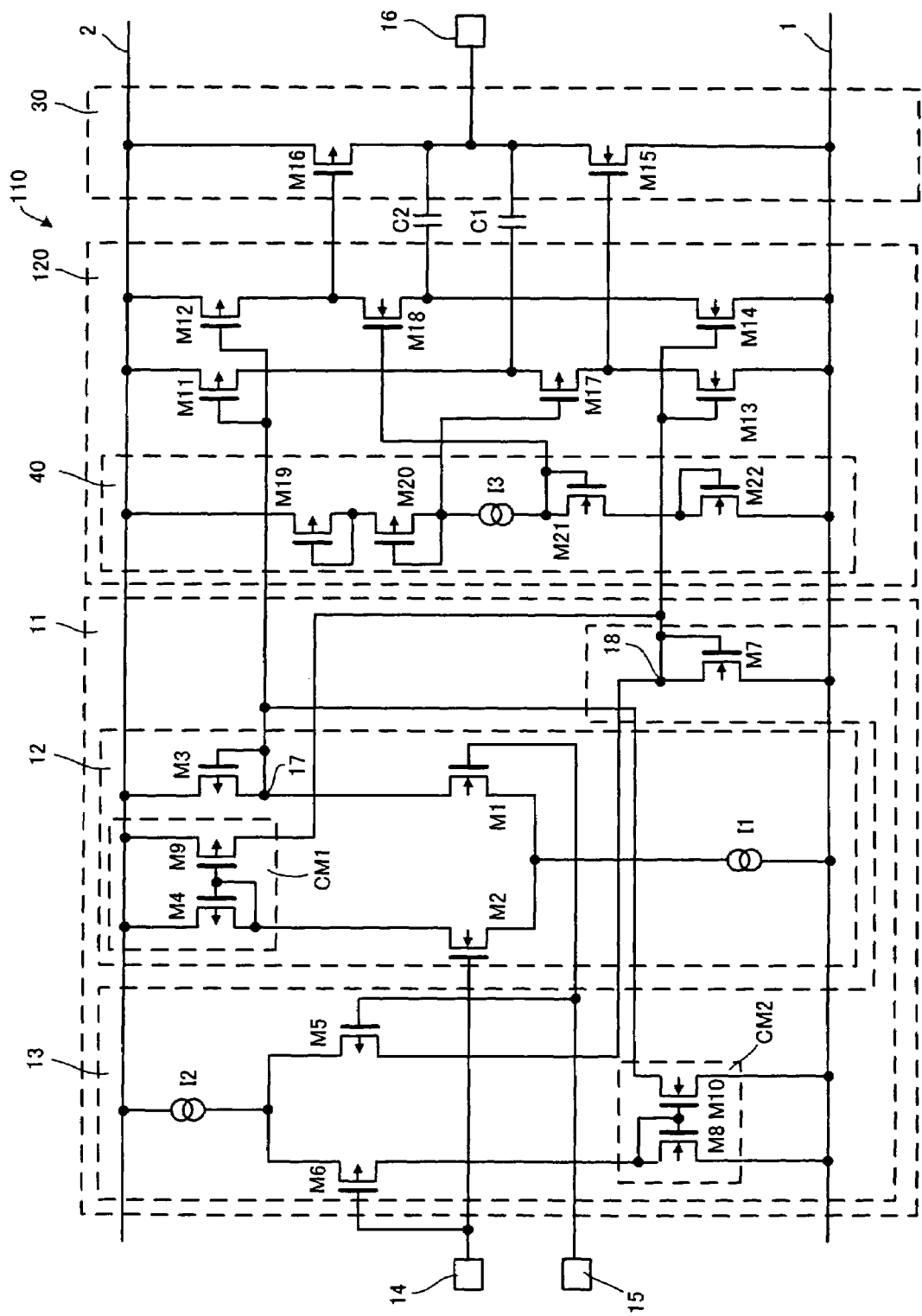
FIG. 2 is a circuit diagram showing a second embodiment of a semiconductor integrated circuit including an output amplifier according to the present invention.

FIG. 2 shows a second embodiment of a circuit diagram of a semiconductor integrated circuit including an output amplifier, in accordance with the present invention.

In the second embodiment, similar to the first embodiment described above, output amplifier 10 includes two input terminals (positive input terminal 14, negative input terminal 15), output terminal 16, differential amplification circuit 11, and output stage 30. And output amplifier 10 also includes output stage control circuit 120.

Since a structure of differential amplification circuit 11, first and second current mirror circuits CM1 and CM2 shown in FIG. 2 are the same as those of the first embodiment shown in FIG. 1, explanation of these parts is omitted.

In the embodiment shown in FIG. 2, output stage control circuit 120 has three p type MOS transistors M11, M12, and M17, three n type MOS transistors M13, M14, and M18, and gate voltage control circuit 40.

Both gate electrodes of p type MOS transistors M11 and M12 are connected to non-inverted output terminal 17 of N type differential amplification circuit 12, and both source electrodes of p type MOS transistors M11 and M12 are connected to second power supply 2.

Both gate electrodes of n type MOS transistors M13 and M14 are connected to non-inverted output terminal 18 of P type differential amplification circuit 13, and both source electrodes of n type MOS transistors M13 and M14 are connected to first power supply 1.

P type MOS transistor M17 has a source electrode connected to the drain electrode of p type MOS transistor M11, and a drain electrode connected to a drain electrode of n type MOS transistor M13.

N type MOS transistor M18 has a source electrode connected to a drain electrode of p type MOS transistor M12, and a drain electrode connected to a drain electrode of n type MOS transistor M14.

Each gate electrode of p type MOS transistor M17 and n type MOS transistor M18 is connected to gate voltage control circuit 40.

Gate voltage control circuit 40 consists of p type MOS transistors M19 and M20, n type MOS transistors M21 and M22, and current source I3.

P type MOS transistor M19 has a source electrode connected to second power supply 2, and a drain electrode connected to a source electrode of p type MOS transistor M20. A drain electrode of p type MOS transistor M20 is connected to one terminal of current source I3.

N type MOS transistor M21 has a drain electrode connected to the opposite side terminal of current source I3, and a source electrode connected to a source electrode of n type MOS transistor M22. A source electrode of n type MOS transistor M22 is connected to first power supply 1.

Each gate electrode of p type MOS transistors M19 and M20 and n type MOS transistors M21 and M22 is connected to the own drain electrode of each transistor.

A gate electrode of p type MOS transistor M17 is connected to the drain electrode of p type MOS transistor M20, and a gate electrode of n type MOS transistor M18 is connected to the drain electrode of n type MOS transistor M21.

Output stage 30 has n type MOS transistor M15 and p type MOS transistor M16.

N type MOS transistor M15 has a source electrode connected to first power supply 1, and a drain electrode connected to a drain electrode of p type MOS transistor M16. A source electrode of p type MOS transistor M16 is connected to second power supply 2.

The drain electrode of n type MOS transistor M15 and the drain electrode of p type MOS transistor M16 of output stage 30 are both connected to output terminal 16 of output amplifier 110.

As shown in FIG. 2, first phase compensation condenser C1 is inserted between the drain electrode of n type MOS transistor M15 and the source electrode of p type MOS transistor M17. Second phase compensation condenser C2 is inserted between the drain electrode of p type MOS transistor M16 and the source electrode of n type MOS transistor M18.

Therefore, a phase compensation circuit of n type MOS transistor M15 includes first phase compensation condenser C1 and p type MOS transistor M17. And, a phase compensation circuit of p type MOS transistor M16 includes second phase compensation condenser C2 and n type MOS transistor M18.

Next, signal processing of output amplifier 110 of the second embodiment is explained.

As in the first embodiment shown in FIG. 1, a difference between a voltage inputted from +input terminal 14 and a voltage inputted from −input terminal 15 is amplified by N type differential amplification circuit 12, and is outputted from the drain electrode of p type MOS transistor M3.

Similarly, a difference between a voltage inputted from +input terminal 14 and a voltage inputted from −input terminal 15 is amplified by P type differential amplification circuit 13, and is outputted from the drain electrode of n type MOS transistor M7.

An inverted-output current of N type differential amplification circuit 12 flows through p type MOS transistor M4.

A drain current of p type MOS transistor M9, which constitutes first current mirror circuit CM1 with p type MOS transistor M4, is an inverted output signal of N type differential amplification circuit 12.

Since the drain electrode of p type MOS transistor M9 is connected to the drain electrode of n type MOS transistor M7 which is non-inverted output terminal 18 of P type differential amplification circuit 13, an inverted output current of N type differential amplification circuit 12 can be added to a non-inverted output current of P type differential amplification circuit 13.

Similarly, the inverted output current of P type differential amplification circuit 13 flows through n type MOS transistor M8.

A drain current of n type MOS transistor M10, which constitutes second current mirror circuit CM2 with n type MOS transistor M8, is an inverted output signal of P type differential amplification circuit 13.

Since the drain electrode of n type MOS transistor M10 is connected to the drain electrode of p type MOS transistor M3, which is non-inverted output terminal 17 of N type differential amplification circuit 12, an inverted output current of P type differential amplification circuit 13 can be added to a non-inverted output current of N type differential amplification circuit 12.

Two output signals that are results of the addition described above are inputted into output stage control circuit 120.

P type MOS transistors M1 and M12 are controlled not only by the non-inverted output signal of N type differential amplification circuit 12 but also by an inverted output signal of P type differential amplification circuit 13.

Similarly, n type MOS transistors M13 and M14 are controlled not only by the non-inverted output signal of P type differential amplification circuit 13 but also by the inverted output signal of N type differential amplification circuit 12.

N type MOS transistor M15 of output stage 30 is controlled by the gate voltage inputted from the drain of n type MOS transistor M13. And the drain voltage of n type MOS transistor M13 is controlled by controlling of the gate voltage of n type MOS transistor M17.

Similarly, p type MOS transistor M16 of output stage 30 is controlled by the gate voltage inputted from the drain of p type MOS transistor M12. And the drain voltage of p type MOS transistor M12 is controlled by controlling a gate voltage of n type MOS transistor M18.

Therefore, the voltage inputted to the gate electrode of n type MOS transistor M15 can be controlled by the gate voltage of p type MOS transistor M17. And the voltage inputted to the gate electrode of p type MOS transistor M16 can be controlled by the gate voltage of n type MOS transistor M18.

Each gate voltage of p type MOS transistor M17 and n type MOS transistor M18 is controlled by gate voltage control circuit 40.

The gate voltage inputted to the gate electrode of p type MOS transistor M17 is the voltage of the drain electrode of p type MOS transistor M20. Similarly, the gate voltage inputted to the gate electrode of n type MOS transistor M18 is the voltage of the drain electrode of n type MOS transistor M21.

When the output amplifier 110 is used as a voltage follower and +input terminal 14 and −input terminal 15 have same potential, each drain current of n type MOS transistors M13 and M14 is almost the same as each drain current of p type MOS transistors M11 and M12, and they will be stable in DC operation.

In this stable DC condition, a source-gate voltage $V_{GS}$ between each gate and each source of n type MOS transistor M15 and p type MOS transistor M16 which constitute output stage 30 may be defined as Va.

In this case, since a drain-source voltage $V_{DS}$ between the drain and the source of n type MOS transistor M13 is Va, $V_{DS}$ of p type MOS transistor M12 is expressed as (VDD−Va) (when first power supply 1 is set to 0V, and second power supply 2 is set to VDD.).

When current source I3 is controlled so that gate voltage control circuit 40 becomes stable in DC operation, all of $V_{GS}$ of p type MOS transistors M19 and M20 and n type MOS transistors M21 and M22 are Va.

Then, a drain voltage of p type MOS transistor M20 becomes (VDD−Va−Va)=(VDD−2Va), and is inputted to the gate electrode of p type MOS transistor M17.

Since $V_{DS}$ of p type MOS transistor M17 which is stable in DC is also Va, a drain voltage of p type MOS transistor M11 becomes (VDD−2Va)+Va=(VDD−Va). Therefore, $V_{DS}$ of p type MOS transistor M11 becomes VDD−(VDD−Va) =Va.

Similarly, a drain voltage of n type MOS transistor M21 becomes Va+Va=2Va, and is inputted to the gate electrode of n type MOS transistor M18.

Since $V_{DS}$ of n type MOS transistor M18 which is stable in DC is also Va, a drain voltage of n type MOS transistor M14 becomes 2Va−Va=Va. Therefore, $V_{DS}$ of n type MOS transistor M14 becomes Va.

Since both $V_{DS}$ of p type MOS transistor M11 and $V_{DS}$ of n type MOS transistor M14 become Va, a voltage balance between two output terminals of output stage control circuit 120 is maintained, and stable voltages can be given to output stage 30.

Considering a case where there are not p type MOS transistor M17 and n type MOS transistor M18 in output stage control circuit 120, $V_{DS}$ of n type MOS transistor M14 may be VDD−Va, and $V_{DS}$ of p type MOS transistor M11 may be Va. Then, in this case, it may be necessary to tune a current ratio of the current mirror circuit of p type MOS transistors M3, M11, and M12, and the current mirror circuit of n type MOS transistors M7, M13, and M14 finely.

On the other hand, p type MOS transistor M17 and n type MOS transistor M18 which are equipped in output stage control circuit 120 work to keep the output of output stage 30 stable, so it may not be necessary to adjust the current ratio of p type MOS transistors M11 and M12 and n type MOS transistors M13 and M14.

Then, phase compensation of n type MOS transistor M15 is determined by a combination of first phase compensation condenser C1 and p type MOS transistor M17. Therefore, since phase compensation is controllable not only by the capacity of first phase compensation condenser C1 but also the resistance of p type MOS transistor M17, it becomes possible to decrease a capacity of first phase compensation condenser C1.

Similarly, also in phase compensation of p type MOS transistor M16, the capacity of second phase compensation condenser C2 can be decreased.

Therefore, a current of operation is reducible by decreasing the capacity of first and second phase compensation condensers C1 and C2.

Moreover, similar to the first embodiment described above, both output signals of N type differential amplification circuit 12 and P type differential amplification circuit 13 are used as direct control signals also not only to p type MOS transistor M16 but also to n type MOS transistor M15 of output stage 30, so linear control of output stage 30 may be realized.

In addition, gate voltage control circuit 40 is not restricted to this mentioned circuit. What is necessary is just to be able to control p type MOS transistor M17 and n type MOS transistor M18 like this embodiment.

Figure 3:
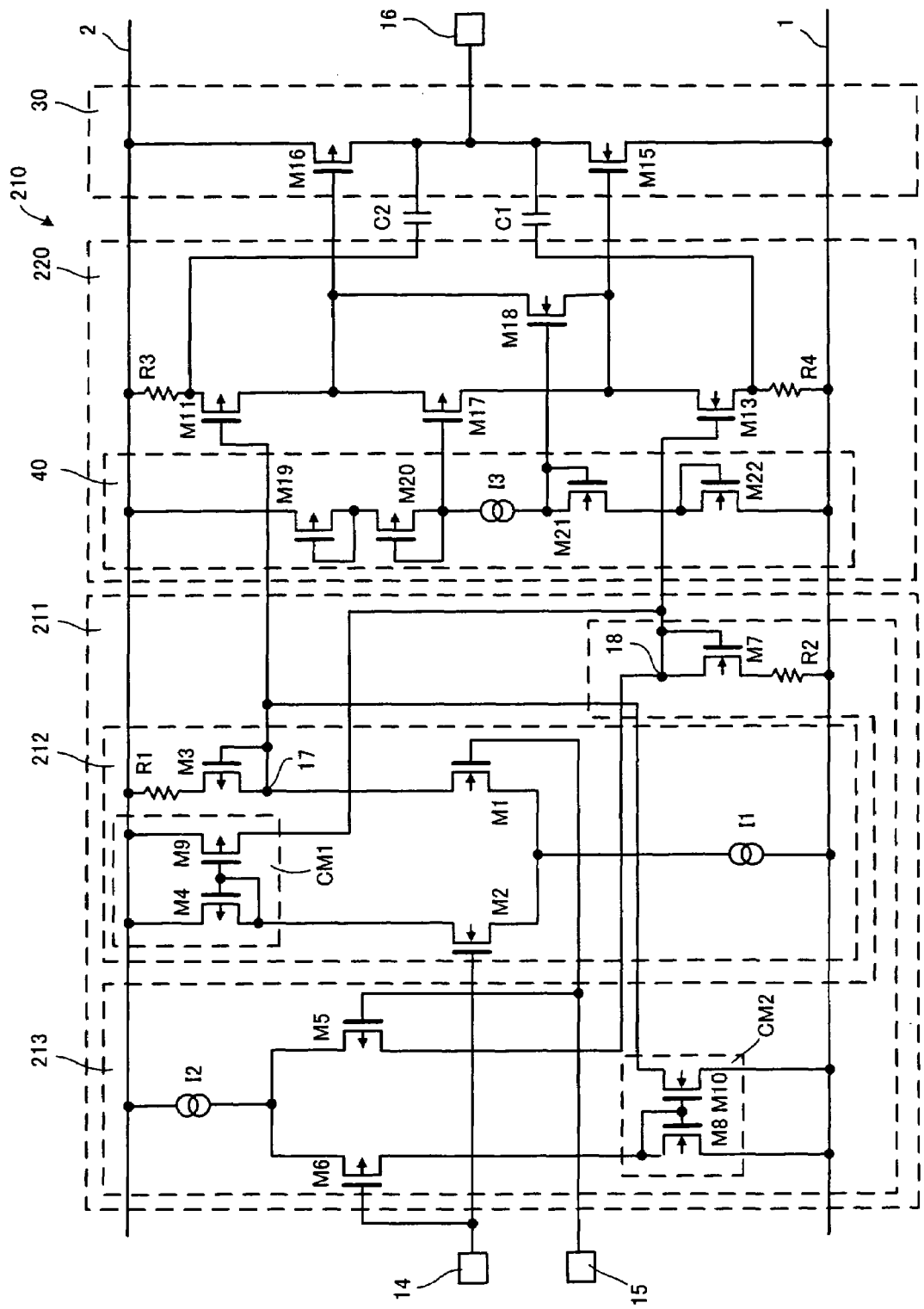
FIG. 3 is a circuit diagram showing a third embodiment of a semiconductor integrated circuit including an output amplifier according to the present invention.

FIG. 3 is a circuit diagram of a semiconductor integrated circuit including an output amplifier according to a third embodiment.

Output amplifier 210 of the third embodiment includes two input terminals (positive input terminal 14, negative input terminal 15), output terminal 16, differential amplification circuit 211, output stage control circuit 220, and output stage 30.

Since a structure of gate voltage control circuit 40, first and second current mirror circuits CM1 and CM2 shown in FIG. 3 are the same as those of the second embodiment shown in FIG. 2, detailed explanation of these parts is omitted.

Differential amplification circuit 211 of this embodiment includes N type differential amplification circuit 212 and P type differential amplification circuit 213. Although, as for N type differential amplification circuit 212, n type MOS transistor M7 is connected to first power supply 1 through resistance R2 unlike N type differential amplification circuit 12 of the second embodiment, the operation is similar to that of N type differential amplification circuit 12. And, although, as for P type differential amplification circuit 213, p type MOS transistor M3 is connected to first power supply 2 through resistance R1 unlike P type differential amplification circuit 13 of the second embodiment, the operation is similar to that of P type differential amplification circuit 13. Then, detailed explanation of differential amplification circuit 211 is omitted.

On the other hand, as for output stage control circuit 220 of this embodiment, the circuit composition differs from output stage control circuit 120 of the second embodiment. Output stage control circuit 120 has the circuit for controlling n type MOS transistor M15 and p type MOS transistor M16 which constitute the output stage 30, respectively. However, output stage control circuit 220 has a circuit for controlling n type MOS transistor M15 and p type MOS transistor M16 in common.

In this exemplary embodiment, output stage control circuit 220 includes a source electrode of p type MOS transistor M17 and a drain electrode of n type MOS transistor M18 connected to a drain electrode of p type MOS transistor M11, having a gate electrode is connected to non-inverted output terminal 17 of N type differential amplification circuit 212. And a drain electrode of p type MOS transistor M17 and a source electrode of n type MOS transistor M18 and a drain electrode of n type MOS transistor M18 are connected common to a drain electrode of n type MOS transistor M13, having a gate electrode is connected to non-inverted output terminal 18 of P type differential amplification circuit 213.

Then, the drain electrode of p type MOS transistor M11 is connected to a gate electrode of p type MOS transistor M16 of output stage 30, and the drain electrode of n type MOS transistor M13 is connected to a gate electrode of n type MOS transistor M15 of output stage 30.

On the other hand, a gate electrode of p type MOS transistor M17 and a gate electrode of the n type MOS transistor M18 are connected to a drain electrode of p type MOS transistor M20 of gate voltage control circuit 40, and a drain electrode of n type MOS transistor M21 respectively as well as the second embodiment.

In addition, in this embodiment, a source electrode of p type MOS transistor M11 and a source electrode of p type MOS transistor M3, which constitutes a current mirror circuit with p type MOS transistor M11 are connected in series with resisters R3 and R1 to second power supply 2, respectively.

Similarly, a source electrode of n type MOS transistor M13 and a source electrode of n type MOS transistor M7, which constitutes a current mirror circuit with n type MOS transistor M13 are connected in series with resisters R4 and R2 to first power supply 1, respectively.

These resisters R1–R4 may suppress change of the characteristic of current mirror circuits by variation in thresholds of transistors.

Moreover, in this embodiment, first phase compensation condenser C1 is inserted between a drain electrode of n type MOS transistor M15 and the source electrode of n type MOS transistor M13, and second phase compensation condenser C2 is inserted between a drain electrode of p type MOS transistor M16 and a source electrode of p type MOS transistor M11.

Therefore, a phase compensation circuit of n type MOS transistor M15 includes first phase compensation condenser C1 and n type MOS transistor M13. And, a phase compensation circuit of p type MOS transistor M16 includes second phase compensation condenser C2 and p type MOS transistor M11.

Also in operation of this embodiment, a voltage inputted to the gate electrode of n type MOS transistor M15 may be controlled by a gate voltage of p type MOS transistor M17, and a voltage inputted to the gate electrode of p type MOS transistor M16 is controlled by gate voltage of n type MOS transistor M18. Therefore, output stage 30 of this embodiment may also operate stably.

In this embodiment, since the number of transistors which constitute output stage control circuit 220 can be reduced, a consumption current of a semiconductor integrated circuit can be lessened.

Moreover, phase compensation in this embodiment is performed with first phase compensation condenser C1 and n type MOS transistor M13, and also with second phase compensation condenser C2 and a p type MOS transistor M11.

Therefore, phase compensation is controllable also by a resistance value of n type MOS transistor M13 and a resistance value of p type MOS transistor M11. Accordingly, also in this embodiment, each capacity of first and second phase compensation condensers C1 and C2 can be decreased.

Figure 4:
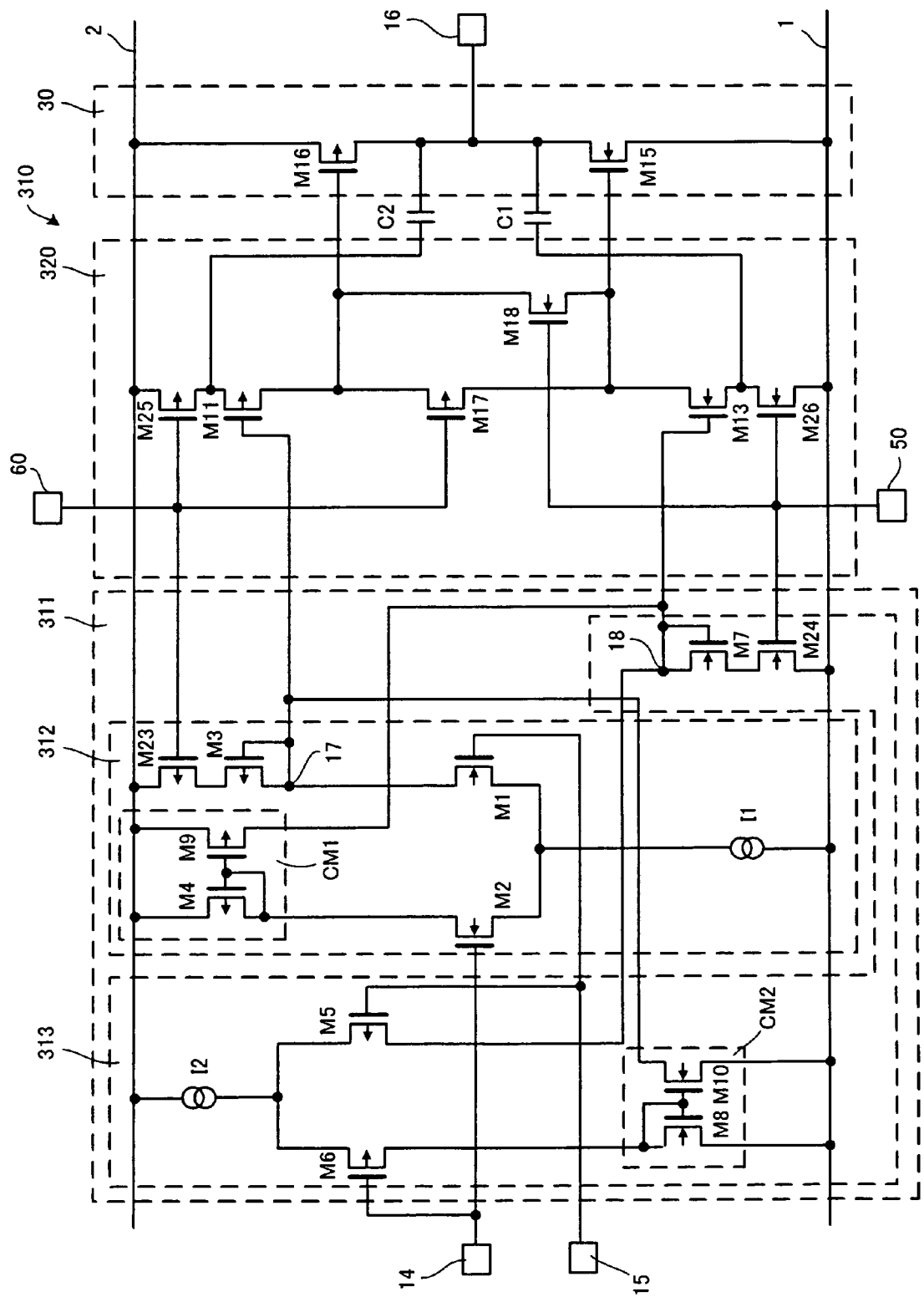
FIG. 4 is a circuit diagram showing a fourth embodiment of a semiconductor integrated circuit including an output amplifier according to the present invention.

FIG. 4 illustrates a circuit diagram of a semiconductor integrated circuit including an output amplifier according to a fourth embodiment.

Output amplifier 310 of the fourth embodiment, similar to the third embodiment shown in FIG. 3, includes two input terminals (positive input terminal 14, negative input terminal 15), output terminal 16, differential amplification circuit 311, output stage control circuit 320, and output stage 30. And output amplifier 310 includes more two input terminals (bias voltage terminal 50, bias voltage terminal 60). With respect to each portion of this embodiment, the same portion of the third embodiment is designated by the same numeral, and its detailed explanation is omitted.

Differential amplification circuit 311 of this embodiment includes N type differential amplification circuit 312 and P type differential amplification circuit 313. Although, as for N type differential amplification circuit 312, n type MOS transistor M7 is connected to first power supply 1 through n type MOS transistor M24 unlike N type differential amplification circuit 212 of the third embodiment, the operation is similar to that of N type differential amplification circuit 212. And, although, as for P type differential amplification circuit 313, p type MOS transistor M3 is connected to first power supply 2 through p type MOS transistor M23 unlike P type differential amplification circuit 213 of the third embodiment, the operation is similar to that of P type differential amplification circuit 13. Then, detailed explanation of differential amplification circuit 311 is omitted.

On the other hand, unlike the third embodiment, output stage control circuit 320 may not contain a gate voltage control circuit 40 being included in output stage control circuit 220 of the third embodiment.

Instead, output amplifier 310 is equipped a bias voltage terminal 50 and a bias voltage terminal 60 as external terminals. Then, bias voltage terminal 50 provides a bias voltage for n type MOS transistors, and bias voltage terminal 60 provides a bias voltage for p type MOS transistors, respectively.

A gate electrode of p type MOS transistor M17 of output stage control circuit 320 is connected to bias voltage terminal 60, and a gate electrode of p type MOS transistor M18 is connected to bias voltage terminal 50. Moreover, the fourth embodiment includes p type MOS transistors M23 and M25, instead of resisters R1 and R3 of the third embodiment, having each gate electrode is connected to bias voltage terminal 60, and also includes n type MOS transistors M24 and M26, instead of resisters R2 and R4 of the third embodiment, having each gate electrode is connected to bias voltage terminal 50.

Accordingly, a drain electrode of p type MOS transistor M23 is connected to a source electrode of a p type MOS transistor M3, and a source electrode of p type MOS transistor M23 is connected to second power supply 2. A drain electrode of p type MOS transistor M25 is connected to a source electrode of a p type MOS transistor M11, and a source electrode of p type MOS transistor M25 is connected to second power supply 2.

Similarly, a drain electrode of n type MOS transistor M24 is connected to a source electrode of an n type MOS transistor M7, and a source electrode of n type MOS transistor M24 is connected to first power supply 1. A drain electrode of n type MOS transistor M26 is connected to a source electrode of an n type MOS transistor M13, and a source electrode of n type MOS transistor M26 is connected to first power supply 1.

Each 'ON' resistance of these p type MOS transistors M23 and M25 and n type MOS transistors M24 and M26 is used instead of each resistance of resisters R1–R4 being used in the third embodiment.

In this embodiment, similar to the third embodiment, first phase compensation condenser C1 is disposed between a drain electrode of n type MOS transistor M15 and the source electrode of n type MOS transistor M13, and second phase compensation condenser C2 is disposed between a drain electrode of p type MOS transistor M16 and the source electrode of p type MOS transistor M11.

Therefore, a phase compensation circuit of n type MOS transistor M15 has first phase compensation condenser C1 and n type MOS transistor M13. And a phase compensation circuit of p type MOS transistor M16 has second phase compensation condenser C2 and p type MOS transistor M11.

Also in operation of this embodiment, a voltage inputted to a gate electrode of n type MOS transistor M15 is controlled by a gate voltage of p type MOS transistor M17, and a voltage inputted to a gate electrode of p type MOS transistor M16 is controlled by a gate voltage n type MOS transistor M18. Therefore, output stage 30 of this embodiment also operates stably.

According to this embodiment, since gate voltage control circuit 40 is not built in, the number of transistors which constitute output amplifier 310 can be reduced. Generally, an LCD driver may typically require many output amplifiers of the same composition to drive many pixels of an LCD simultaneously. Therefore, using output amplifier 10 of this embodiment brings the effect of decreasing markedly a transistor count to an integrated circuit for such an LCD driver.

Moreover, in this embodiment, since p type MOS transistors M23 and M25 and n type transistor M24 and M26 are used as resistance elements, a chip area of such integrated circuit can be greatly small rather than it forms a resistance element by a poly-silicon layer, etc.

What is claimed is:

1. A semiconductor integrated circuit, comprising:
a first differential amplification device with a first polarity, the first differential amplification device being configured to amplify a voltage difference of two input signals inputted from a positive input terminal and a negative input terminal respectively;
a second differential amplification device with a second polarity opposite of the first polarity, the second differential amplification device being configured to amplify the voltage difference of two input signals inputted from the positive input terminal and the negative input terminal respectively;
a first addition device configured to add a non-inverted output of the first differential amplification device and an inverted output of the second differential amplification device;
a second addition device configured to add a non-inverted output of the second differential amplification device and an inverted output of the first differential amplification device;
an output stage control device having first and second switching elements, the first switching element with the first polarity controlled by an output signal of the second addition device, and the second switching element with the second polarity controlled by an output signal of the first addition device;
an output stage having a third switching element with the first polarity controlled by an output signal of the first switching element of the output stage control device, and a fourth switching element with the second polarity controlled by an output signal of the second switching element of the output stage control device; and
an output terminal configured to be connected to an output terminal of the third switching element and an output terminal of the fourth switching element in common.

2. The semiconductor integrated circuit according to claim 1, wherein the output stage control device includes an output stabilization circuit, the output stabilization circuit being configured to control each operating current of the first and the second switching elements, and the output stabilization circuit having a phase compensation function of the output stage.

3. A semiconductor integrated circuit, comprising:
a positive input terminal;
a negative input terminal;
a first differential amplification circuit with a first polarity having a first positive input terminal connected to the positive input terminal, a first negative input terminal connected to the negative input terminal, a first non-inverted output terminal configured to output an output signal, the output signal being amplified a voltage difference of two input signals inputted from the first positive input terminal and the first negative input terminal, and a first inverted output terminal outputting an inverted output signal being inverted signal of the output signal of the first non-inverted output terminal;
a second differential amplification circuit with a second polarity opposite of the first polarity, having a second positive input terminal connected to the positive input terminal, a second negative input terminal connected to the negative input terminal, a second non-inverted output terminal configured to output an output signal, the output signal being amplified a voltage difference of two input signals inputted from the second positive-input terminal and the second negative input terminal, and a second inverted output terminal outputting an inverted output signal being inverted signal of the output signal of the second non-inverted output terminal;
a first current addition device configured to add a current, the current being configured to flow at the first non-inverted output terminal of the first differential amplification circuit and a current, the current being configured to flow at the second inverted output terminal of the second differential amplification circuit;
a second current addition device configured to add a current, the current being configured to flow at the second non-inverted output terminal of the second differential amplification circuit and a current, the current being configured to flow at the first inverted output terminal of the first differential amplification circuit;
an output stage control device having a first switching element with the first polarity having a control terminal connected to an output terminal of the second current addition device, and a second switching element with the second polarity having a control terminal connected to an output terminal of the first current addition device;
an output stage having a third switching element with the first polarity having a control terminal connected to an output terminal of the first switching element, and a fourth switching element with the second polarity having a control terminal connected to an output terminal of the second switching element;
an output terminal configured to be connected an output terminal of the third switching element and an output terminal of the fourth switching element in common;
a first phase compensation circuit connecting between the output terminal of the third switching element and the control terminal of the third switching element; and a second phase compensation circuit connecting between the output terminal of the fourth switching element and the control terminal of the fourth switching element.

4. The semiconductor integrated circuit according to claim 3, wherein the first differential amplification circuit includes:
   a first n type transistor having a gate electrode connected to the positive input terminal;
   a second n type transistor having a gate electrode connected to the negative input terminal;
   a first current source having one terminal connected common to a source electrode of the first n type transistor and a source electrode of the second n type transistor, and an opposite side terminal is connected to a first power supply;
   a first p type transistor having a drain electrode and a gate electrode connected to a drain electrode of the first n type transistor, and a source electrode connected to a second power supply;
   a second p type transistor having a drain electrode being the first non-inverted output terminal and a gate electrode connected to a drain electrode of the second n type transistor, and a source electrode connected to the second power supply; and
   a third p type transistor having a gate electrode connected to the gate electrode of the first p type transistor, a source electrode connected to the second power supply, and a drain electrode being the first inverted output terminal, and
   wherein the second differential amplification circuit includes:
   a fourth p type transistor having a gate electrode connected to the positive input terminal;
   a fifth p type transistor having a gate electrode connected to the negative input terminal;
   a second current source having one terminal connected common to a source electrode of the fourth p type transistor and a source electrode of the fifth p type transistor, and an opposite side terminal connected to the second power supply;
   a third n type transistor having a drain electrode and a gate electrode connected to a drain electrode of the fourth p type transistor, and a source electrode connected to the first power supply;
   a fourth n type transistor having a drain electrode being the second non-inverted output terminal and a gate electrode connected to a drain electrode of the fifth p type transistor, and a source electrode connected to the first power supply; and
   a fifth n type transistor having a gate electrode connected to the gate electrode of the third n type transistor, a source electrode connected to the first power supply, and a drain electrode being the second inverted output terminal.

5. The semiconductor integrated circuit according to claim 3, wherein the first differential amplification circuit includes:
   a first n type transistor having a gate electrode connected to the positive input terminal;
   a second n type transistor having a gate electrode connected to the negative input terminal;
   a first current source having one terminal connected common to a source electrode of the first n type transistor and a source electrode of the second n type transistor, and an opposite side terminal is connected to a first power supply;
   a first p type transistor having a drain electrode and a gate electrode connected to a drain electrode of the first n type transistor, and a source electrode connected to a second power supply;
   a second p type transistor having a drain electrode being the first non-inverted output terminal and a gate electrode connected to a drain electrode of the second n type transistor, and a source electrode connected in series with a first resistor to the second power supply; and
   a third p type transistor having a gate electrode connected to the gate electrode of the first p type transistor, a source electrode connected to the second power supply, and a drain electrode being the first inverted output terminal, and
   wherein the second differential amplification circuit includes:
   a fourth p type transistor having a gate electrode connected to the positive input terminal;
   a fifth p type transistor having a gate electrode connected to the negative input terminal;
   a second current source having one terminal connected common to a source electrode of the fourth p type transistor and a source electrode of the fifth p type transistor, and an opposite side terminal connected to the second power supply;
   a third n type transistor having a drain electrode and a gate electrode connected to a drain electrode of the fourth p type transistor, and a source electrode connected to the first power supply;
   a fourth n type transistor having a drain electrode being the second non-inverted output terminal and a gate electrode connected to a drain electrode of the fifth p type transistor, and a source electrode connected in series with a second resistor to the first power supply; and
   a fifth n type transistor having a gate electrode connected to the gate electrode of the third n type transistor, a source electrode connected to the first power supply, and a drain electrode being the second inverted output terminal.

6. The semiconductor integrated circuit according to claim 3, wherein the first current addition device has an output terminal being connected to the first non-inverted output terminal of the first differential amplification circuit and the second inverted output terminal of the second differential amplification circuit, and wherein the second current addition device has an output terminal being connected the second non-inverted output terminal of the second differential amplification circuit and the first inverted output terminal of the first differential amplification circuit.

7. The semiconductor integrated circuit according to claim 5, wherein the output stage control device includes:
   sixth and seventh n type transistors having each source electrode connected to the first power supply, and each gate electrode connected to the output terminal of the second current addition device; and
   sixth and seventh p type transistors having each source electrode connected to the second power supply, each gate electrode connected to the output terminal of the first current addition device, and each drain electrode connected to each drain electrode of the sixth and a seventh n type transistors respectively, and
   wherein the output stage includes:
   an eighth n type transistor having a source electrode connected to the first power supply, a drain electrode connected the output terminal, and a gate electrode connected to the drain electrode of the sixth n type transistor, and;

an eighth p type transistor having a source electrode is connected to the second power supply, a drain electrode connected the output terminal, and a gate electrode connected to a drain electrode of the seventh p type transistor.

8. The semiconductor integrated circuit according to claim 6, wherein the output stage control device includes:

sixth and seventh n type transistors having each source electrode connected to the first power supply, and each gate electrode connected to the output terminal of the second current addition device;

sixth and seventh p type transistors having each source electrode connected to the second power supply, each gate electrode connected to the output terminal of the first current addition device, and each drain electrode connected to each drain electrode of the sixth and a seventh n type transistors respectively;

an eighth n type transistor having a source electrode connected to a drain electrode of the seventh n type transistor, and a drain electrode connected to a drain electrode of the seventh p type transistor;

an eighth p type transistor having a source electrode connected to a drain electrode of the sixth p type transistor, and a drain electrode connected to a drain electrode of the sixth n type transistor; and a gate voltage control circuit having a first output terminal connected to a gate electrode of the eighth n type transistor and a second output terminal connected to a gate electrode of the eighth p type transistor to control each gate voltage respectively, and wherein the output stage includes:

a ninth n type transistor having a source electrode connected to the first power supply, a drain electrode connected the output terminal, and a gate electrode connected to the drain electrode of the sixth n type transistor, and;

a ninth p type transistor having a source electrode is connected to the second power supply, a drain electrode connected the output terminal, and a gate electrode connected to a drain electrode of the seventh p type transistor.

9. The semiconductor integrated circuit according to claim 5, wherein the output stage control device includes:

a sixth n type transistors having a source electrode connected in series with a third resistor to the first power supply, and a gate electrode connected to the output terminal of the second current addition device;

a sixth p type transistors having a source electrode connected in series with a fourth resistor to the second power supply, and a gate electrode connected to the output terminal of the first current addition device;

a seventh n type transistor having a source electrode connected to a drain electrode of the sixth n type transistor, and a drain electrode connected to a drain electrode of the sixth p type transistor;

a seventh p type transistor having a source electrode connected to the drain electrode of the sixth p type transistor, and a drain electrode connected to the drain electrode of the sixth n type transistor; and a gate voltage control circuit having a first output terminal connected to a gate electrode of the seventh n type transistor and a second output terminal connected to a gate electrode of the seventh p type transistor to control each gate voltage respectively, and wherein the output stage includes:

an eighth n type transistor having a source electrode connected to the first power supply, a drain electrode connected the output terminal, and a gate electrode connected to the drain electrode of the sixth n type transistor; and an eighth p type transistor having a source electrode is connected to the second power supply, a drain electrode connected the output terminal, and a gate electrode connected to a drain electrode of the sixth p type transistor.

10. The semiconductor integrated circuit according to claim 8, wherein the gate voltage control circuit includes:

a tenth n type transistor having a drain electrode and a gate electrode connected to the first output terminal, an eleventh n type transistor having a drain electrode and a gate electrode connected to a source electrode of the tenth n type transistor, and a source electrode connected to the first power supply, a tenth p type transistor having a drain electrode and a gate electrode connected to the second output terminal, an eleventh p type transistor having a drain electrode and a gate electrode connected to a source electrode of the tenth p type transistor, and a source electrode connected to the second power supply, a third current source having one terminal connected to the drain electrode of the tenth n type transistor, and an opposite side terminal connected to the drain electrode of the tenth p type transistor.

11. The semiconductor integrated circuit according to claim 9, wherein the gate voltage control circuit includes:

a tenth n type transistor having a drain electrode and a gate electrode connected to the first output terminal, an eleventh n type transistor having a drain electrode and a gate electrode connected to a source electrode of the tenth n type transistor, and a source electrode connected to the first power supply, a tenth p type transistor having a drain electrode and a gate electrode connected to the second output terminal, an eleventh p type transistor having a drain electrode and a gate electrode connected to a source electrode of the tenth p type transistor, and a source electrode connected to the second power supply, a third current source having one terminal connected to the drain electrode of the tenth n type transistor, and an opposite side terminal connected to the drain electrode of the tenth p type transistor.

12. The semiconductor integrated circuit according to claim 7, further including a first phase compensation circuit having a first condenser connecting between the drain electrode and the gate electrode of the eighth n type transistor, and a second phase compensation circuit having a second condenser connecting between the drain electrode and the gate electrode of the eighth p type transistor.

13. The semiconductor integrated circuit according to claim 8, further including a first phase compensation circuit having a first condenser connecting between the drain electrode of the ninth n type transistor and the gate electrode of the eighth p type transistor, and a second phase compensation circuit having a second condenser connecting between the drain electrode of the ninth p type transistor and the gate electrode of the eighth n type transistor.

14. The semiconductor integrated circuit according to claim 9, further including a first phase compensation circuit having a first condenser connecting between the drain electrode of the eighth n type transistor and the gate electrode of the sixth p type transistor, and a second phase compensation circuit having a second condenser connecting between the drain electrode of the eighth p type transistor and the gate electrode of the sixth n type transistor.

15. A semiconductor integrated circuit, comprising:
a first bias voltage terminal;
a second bias voltage terminal; a positive input terminal;
a negative input terminal;
a first differential amplification circuit with a first polarity having a first positive input terminal connected to the positive input terminal, a first negative input terminal connected to the negative input terminal, a first non-inverted output terminal configured to output an output signal, the output signal being amplified a voltage difference of two input signals inputted from the first positive input terminal and the first negative input terminal, and a first inverted output terminal outputting an inverted output signal being inverted signal of the output signal of the first non-inverted output terminal;
a second differential amplification circuit with a second polarity opposite of the first polarity, having a second positive input terminal connected to the positive input terminal, a second negative input terminal connected to the negative input terminal, a second non-inverted output terminal configured to output an output signal, the output signal being amplified a voltage difference of two input signals inputted from the second positive-input terminal and the second negative input terminal, and a second inverted output terminal outputting an inverted output signal being inverted signal of the output signal of the second non-inverted output terminal;
a first current addition device configured to add a current, the current being configured to flow at the first non-inverted output terminal of the first differential amplification circuit and a current, the current being configured to flow at the second inverted output terminal of the second differential amplification circuit;
a second current addition device configured to add a current, the current being configured to flow at the second non-inverted output terminal of the second differential amplification circuit and a current, the current being configured to flow at the first inverted output terminal of the first differential amplification circuit;
an output stage control device having a first switching element with the first polarity having a control terminal connected to an output terminal of the second current addition device, a second switching element with the second polarity having a control terminal connected to an output terminal of the first current addition device, a third switching element controlling an output voltage of the second switching element with the first polarity having a control terminal connected to the first bias voltage terminal, and a fourth switching element controlling an output voltage of the first switching element with the second polarity having a control terminal connected to the second bias voltage terminal;
an output stage having a fifth switching element with the first polarity having a control terminal connected to an output terminal of the first switching element, and a sixth switching element with the second polarity having a control terminal connected to an output terminal of the second switching element;
an output terminal configured to be connected an output terminal of the fifth switching element and an output terminal of the sixth switching element in common;

a first phase compensation circuit connecting between the output of the fifth switching element terminal and the control terminal of the fifth switching element; and
a second phase compensation circuit connecting between the output terminal of the sixth switching element and the control terminal of the sixth switching element.

16. The semiconductor integrated circuit according to claim 15, wherein the first differential amplification circuit includes:
a first n type transistor having a gate electrode connected to the positive input terminal;
a second n type transistor having a gate electrode connected to the negative input terminal;
a first current source having one terminal connected common to a source electrode of the first n type transistor and a source electrode of the second n type transistor, and an opposite side terminal is connected to a first power supply;
a first p type transistor having a drain electrode and a gate electrode connected to a drain electrode of the first n type transistor, and a source electrode connected to a second power supply;
a second p type transistor having a gate electrode connected to the second bias voltage terminal, and a source electrode connected to the second power supply;
a third p type transistor having a drain electrode being the first non-inverted output terminal and a gate electrode connected to a drain electrode of the second n type transistor, and a source electrode connected to a drain electrode of the second p type transistor; and
a fourth p type transistor having a gate electrode connected to the gate electrode of the first p type transistor, a source electrode connected to the second power supply, and a drain electrode being the first inverted output terminal, and
wherein the second differential amplification circuit includes:
a fifth p type transistor having a gate electrode connected to the positive input terminal;
a sixth p type transistor having a gate electrode connected to the negative input terminal;
a second current source having one terminal connected common to a source electrode of the fifth p type transistor and a source electrode of the sixth p type transistor, and an opposite side terminal connected to the second power supply;
a third n type transistor having a drain electrode and a gate electrode connected to a drain electrode of the fifth p type transistor, and a source electrode connected to the first power supply;
a fourth n type transistor having a gate electrode connected to the first bias voltage terminal, and a source electrode connected to the first power supply;
a fifth n type transistor having a drain electrode being the second non-inverted output terminal and a gate electrode connected to a drain electrode of the sixth p type transistor, and a source electrode connected to a drain electrode of the fourth n type transistor; and
a sixth n type transistor having a gate electrode connected to the gate electrode of the third n type transistor, a source electrode connected to the first power supply, and a drain electrode being the second inverted output terminal.

17. The semiconductor integrated circuit according to claim 15, wherein the first current addition device has an output terminal being connected to the first non-inverted output terminal of the first differential amplification circuit and the second inverted output terminal of the second differential amplification circuit, and wherein the second current addition device has an output terminal being connected the second non-inverted output terminal of the second differential amplification circuit and the first inverted output terminal of the first differential amplification circuit.

18. The semiconductor integrated circuit according to claim 16, wherein the output stage control device includes:
   a seventh n type transistor having a gate electrode connected to the first bias voltage terminal, and a source electrode connected to the first power supply;
   an eighth n type transistors having a source electrode connected to a drain electrode of the seventh n type transistor, and a gate electrode connected to the output terminal of the second current addition device;
   a seventh p type transistor having a gate electrode connected to the second bias voltage terminal, and a source electrode connected to the second power supply;
   an eighth p type transistors having a source electrode connected to a drain electrode of the seventh p type transistor, and a gate electrode connected to the output terminal of the first current addition device;
   a ninth n type transistor having a gate electrode connected to the first bias voltage terminal, a source electrode connected to a drain electrode of the eighth n type transistor, and a drain electrode connected to a drain electrode of the eighth p type transistor; and
   a ninth p type transistor having a gate electrode connected to the second bias voltage terminal, a source electrode connected to the drain electrode of the eighth p type transistor, and a drain electrode connected to the drain electrode of the eighth n type transistor, and wherein the output stage includes:
   a tenth n type transistor having a source electrode connected to the first power supply, a drain electrode connected the output terminal, and a gate electrode connected to the drain electrode of the eighth n type transistor, and;
   a tenth p type transistor having a source electrode is connected to the second power supply, a drain electrode connected the output terminal, and a gate electrode connected to a drain electrode of the eighth p type transistor.

19. The semiconductor integrated circuit according to claim 18, further including a first phase compensation circuit having a first condenser connecting between the drain electrode of the tenth n type transistor and the source electrode of the eighth n type transistor, and a second phase compensation circuit having a second condenser connecting between the drain electrode of the tenth p type transistor and the source electrode of the eighth p type transistor.

* * * * *